United States Patent
Sacca et al.

(10) Patent No.: US 7,031,462 B2
(45) Date of Patent: Apr. 18, 2006

(54) ELECTRONIC INDUCTOR WITH TRANSMIT SIGNAL TELEPHONE LINE DRIVER

(75) Inventors: Frank Sacca, Diamond Bar, CA (US); Raphael Rahamim, Orange, CA (US)

(73) Assignee: Silicon Laboratories, Inc., Austin, TX (US)

( * ) Notice: Subject to any disclaimer, the term of this patent is extended or adjusted under 35 U.S.C. 154(b) by 5 days.

(21) Appl. No.: 10/600,491

(22) Filed: Jun. 20, 2003

(65) Prior Publication Data

US 2004/0081314 A1   Apr. 29, 2004

Related U.S. Application Data

(63) Continuation of application No. 09/312,136, filed on May 14, 1999, now Pat. No. 6,584,196.

(51) Int. Cl.
*H04M 1/76* (2006.01)
*H04M 1/738* (2006.01)
(52) U.S. Cl. .................. 379/412; 379/393; 379/394
(58) Field of Classification Search ............. 379/412, 379/399.01, 393, 394
See application file for complete search history.

(56) References Cited

U.S. PATENT DOCUMENTS

| | | | |
|---|---|---|---|
| 3,872,391 A | 3/1975 | Dalley | |
| 4,214,130 A | 7/1980 | Questad | |
| 4,437,146 A | 3/1984 | Carpenter | |
| 4,465,903 A | 8/1984 | Barber | |
| 4,514,704 A | 4/1985 | Curtis | |
| 4,528,424 A | 7/1985 | Middleton et al. | |
| 4,607,140 A | 8/1986 | Schorr | |
| 4,607,141 A | 8/1986 | Schorr | |
| 4,623,799 A | 11/1986 | Nyman, Jr. | |
| 4,794,640 A | * 12/1988 | Yeh | 379/412 |
| 4,796,295 A | * 1/1989 | Gay et al. | 379/398 |
| 5,220,597 A | * 6/1993 | Horiuchi | 379/413 |
| 5,349,638 A | 9/1994 | Pitroda et al. | |
| 5,351,289 A | 9/1994 | Logsdon et al. | |
| 5,361,296 A | 11/1994 | Reyes et al. | |
| 5,369,666 A | 11/1994 | Folwell et al. | |
| 5,465,298 A | 11/1995 | Wilkison et al. | |

(Continued)

FOREIGN PATENT DOCUMENTS

FR    2403690    4/1979

(Continued)

OTHER PUBLICATIONS

Huffman, Jim, "How to Design Your Own Power Supplies"; Popular Electronics, an Electronics Magazine, Jun. 1975; pp. 36-39.

(Continued)

*Primary Examiner*—Daniel Swerdlow
(74) *Attorney, Agent, or Firm*—Farjami & Farjami LLP

(57) ABSTRACT

In an electronic inductor circuit, an operational amplifier drives the base of the electronic inductor transistor, and receives negative feedback from the emitter of the transistor. The transistor and operational amplifier combine to form a voltage-controlled, current source (VCCS) with respect to the loop current. A voltage divider connected across the rectified Tip and Ring voltage (or another node of the circuit at an equivalent voltage) provides a DC reference to the positive input of the operational amplifier, so that the line current automatically increases with an increase in line voltage. A capacitor couples the transmit signal driver to the positive input of the operational amplifier. This electronic inductor circuit can be driven using a low voltage supply and provides sufficient linearity for high-speed modem applications.

13 Claims, 3 Drawing Sheets

U.S. PATENT DOCUMENTS

| | | | |
|---|---|---|---|
| 5,473,552 A | 12/1995 | Chen et al. | |
| 5,544,241 A | 8/1996 | Dibner et al. | |
| 5,546,448 A | 8/1996 | Caswell et al. | |
| 5,606,598 A * | 2/1997 | Karnowski et al. | 379/79 |
| 5,608,795 A * | 3/1997 | Gay | 379/399.01 |
| 5,675,640 A | 10/1997 | Tappert et al. | |
| 5,734,703 A * | 3/1998 | Hiyoshi | 379/412 |
| 5,764,694 A | 6/1998 | Rahamim et al. | |
| 5,771,281 A | 6/1998 | Batten, Jr. | |
| 5,781,621 A | 7/1998 | Lim et al. | |
| 5,790,656 A | 8/1998 | Rahamim et al. | |
| 5,796,815 A | 8/1998 | Guercio et al. | |
| 5,799,060 A | 8/1998 | Kennedy et al. | |

FOREIGN PATENT DOCUMENTS

| | | |
|---|---|---|
| GB | 2117590 A | 10/1983 |

OTHER PUBLICATIONS

Rosenberg, J.M. (Editor), "Dictionary of Computers, Information Processing, and Telecommunications"; 2nd Edition, John Wiley & Sons, 1987; pp. 143-144.

Jung, W.G., "Op-Amp Cook Book", 3rd Edition, Prentice Hall PTR, 1997; chapt. 4 (pp. 199-223), and chapt. 5 (pp. 225-287).

* cited by examiner

ELECTRONIC INDUCTOR WITH TRANSMIT SIGNAL TELEPHONE LINE DRIVER

CROSS-REFERENCES TO RELATED APPLICATIONS

This application is a continuation of U.S. Ser. No. 09/312,136, filed on May 14, 1999 now U.S. Pat. No. 6,584,196.

This application is related to the following U.S. patent applications: U.S. patent application Ser. No. 09/212,707, entitled, TELEPHONE LINE INTERFACE CIRCUIT WITHOUT HOOKSWITCH, filed Dec. 16, 1998; U.S. patent application Ser. No. 09/312,218, entitled, TELEPHONE LINE INTERFACE CIRCUIT WITH VIRTUAL IMPEDANCE, filed May 14, 1999. All applications are commonly assigned to the assignee of the present application, and the disclosure of each are herein explicitly incorporated by reference.

BACKGROUND OF THE INVENTION

1. Field of the Invention

The present invention relates generally to the field of modem circuits, and more particularly, to an electronic inductor circuit suitable for use in the interface circuit of a high-speed modem.

2. Description of Related Art

A prior art electronic inductor circuit 10, also known as a gyrator, is illustrated in FIG. 1. An electronic inductor typically consists of a transistor 12 with an emitter resistor Re 14, further biased by a resistor divider 16, 18. The resistor divider 16, 18 is connected across the rectified voltage Tip and Ring lines, and a large capacitor $C_2$ is placed between the base of the transistor 12 and ground to block any AC signals on the telephone line from modulating the collector current of the transistor 12. The electronic inductor is part of the telephone line interface circuit that connects a modem to a telephone line. In this configuration, the electronic inductor determines the DC operating point of the modem or the telephone line without affecting the AC response of the signal transmitted or received.

To transmit a signal into the telephone line, it is customary to superimpose the signal across the Tip and Ring lines by means of a capacitor, transformer, or both. Since the line impedance is 600 ohms, driving the line generally requires a low-impedance signal driver capable of a voltage swing as large as 5 volts peak-to-peak. This swing is difficult to achieve with standard power supplies of 5 volts, and impossible to achieve when using 3 volt power supplies. Other drawbacks to this circuit include the required switch 20, and the large capacitance required for $C_1$.

The voltage swing problem is generally solved by using two differential transmit drivers of one-half the desired swing, one single driver with virtually rail-to-rail output swing, or one single driver with a power supply greater than 5 volts. Another approach is to drive the base of the transistor 32 in the electronic inductor 30 with the transmit signal 44, after decoupling the base from the voltage divider 36, 38 with a suitable resistor 40, as shown in FIG. 2. Similar configurations are currently used for telephone answering machines. In the latter configuration, however, the non-linear characteristics of the transistor 32 are reflected into the signal transmitted on the line, and the signal lacks the linearity required for high-speed modem applications.

SUMMARY OF THE INVENTION

The present invention is an electronic inductor circuit in which an operational amplifier drives the base of the electronic inductor transistor, and receives negative feedback from the emitter of the transistor. The transistor and operational amplifier combine to form a voltage-controlled current source (VCCS) with respect to loop current. A voltage divider connected across the rectified Tip and Ring voltage (or another node of the circuit at an equivalent voltage) provides a DC reference to the positive input of the operational amplifier, so that the line current automatically increases with an increase in line voltage. A capacitor couples the transmit signal driver to the positive input of the operational amplifier. The voltage feedback to the transistor is generally different for the AC and DC signals, which effectively translates to different AC and DC currents through the loop. A second transistor may also be used to provide increased isolation for the AC modem when the device is on-hook.

In this configuration, the operational amplifier linearizes the voltage signal at the emitter of the transistor (through the negative feedback input), and causes the line current to swing linearly. Specifically, if the collector voltage is sufficiently above Ve, the harmonic content or distortion of the transmitted signal is at least 80 dB below the fundamental signal level.

The present invention may also be configured using a Darlington transistor pair in order to minimize the current required by the operational amplifier driver into the base of the first transistor.

BRIEF DESCRIPTION OF THE DRAWINGS

The exact nature of this invention, as well as its objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an electronic inductor circuit suitable for high-speed modem applications.

Figure 3:
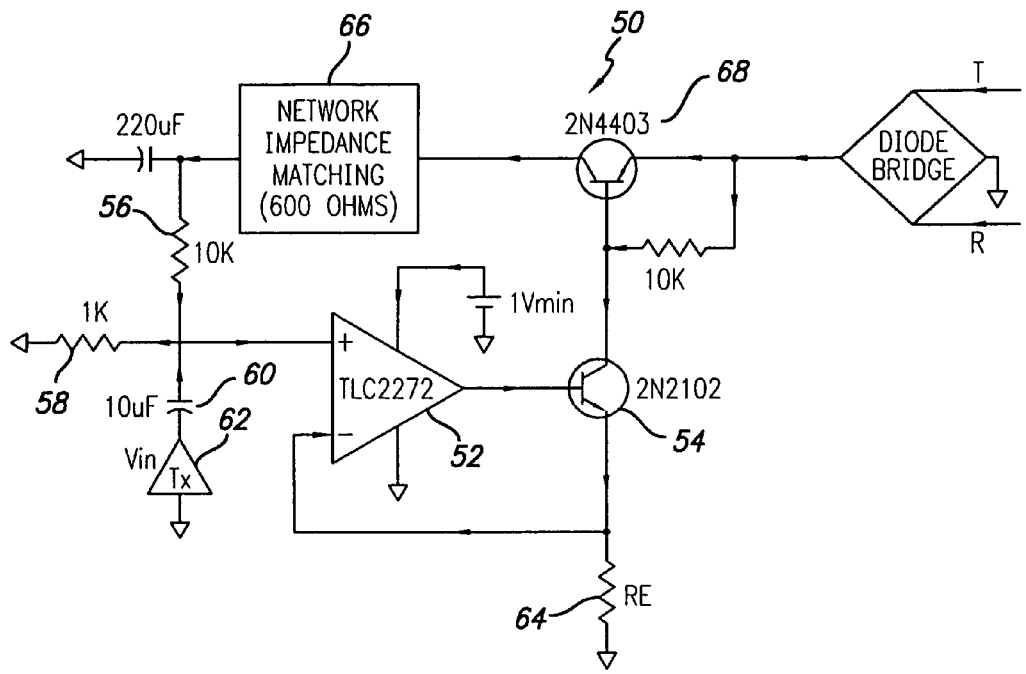
FIG. 3 is a schematic diagram of a first embodiment of the present invention.

A preferred embodiment 50 of the present invention is illustrated in FIG. 3. An operational amplifier 52 drives the base of the electronic inductor transistor 54, and receives negative feedback from the emitter of the transistor 54. The transistor and operational amplifier combine to form a voltage-controlled current source (VCCS) with respect to loop current. A voltage divider 56, 58 connected across the rectified Tip and Ring voltage (or another node of the circuit at an equivalent voltage) provides a DC reference to the positive input of the operational amplifier 52, so that the line current automatically increases with an increase in line voltage. A capacitor 60 couples the transmit signal driver 62 to the positive input of the operational amplifier 52. The voltage feedback to the transistor 54 is generally different for the AC and DC signals, which effectively translates to different AC and DC currents through the loop. A second transistor 66 provides increased isolation for the AC modem when the device is on-hook.

Figure 1:
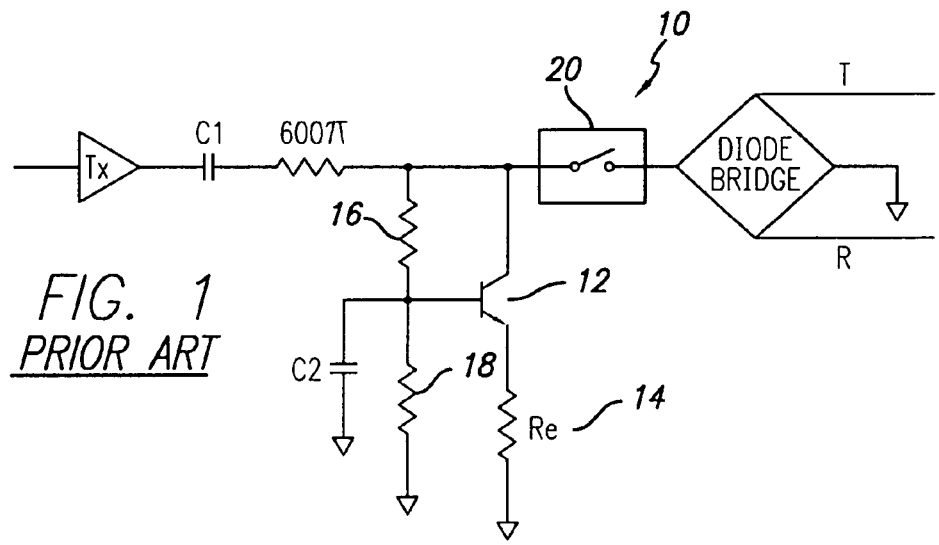
FIG. 1 is schematic diagram of a prior-art electronic inductor circuit.
Figure 2:
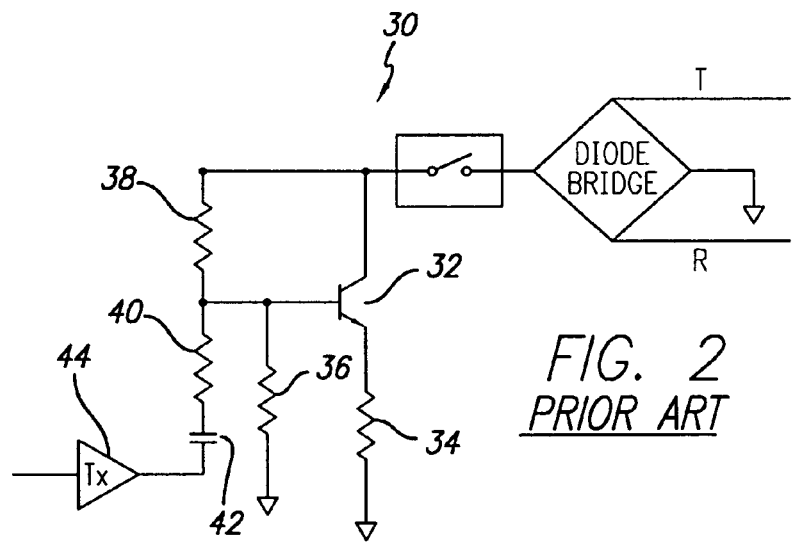
FIG. 2 is a schematic diagram of a second prior-art electronic inductor circuit.

In this configuration, the operational amplifier 52 linearizes the voltage signal at the emitter of the transistor 54 (through the negative feedback input), and causes the line current to swing linearly according to the expression $I=Ve/Re$, where I is the line current, Ve is the emitter voltage, and Re is the value of the emitter resistor 64. If the collector voltage is well above Ve, which can be made to be always true by selecting a suitable resistor voltage divider ratio, the harmonic content or distortion of the transmitted signal is at least 80 dB below the fundamental signal level. This is an acceptable level of distortion for high-speed modem applications and a significant improvement over the circuit shown in FIG. 2.

The network impedance matching block 66 may be designed as either an RC network, or any other suitable circuitry.

Figure 4:
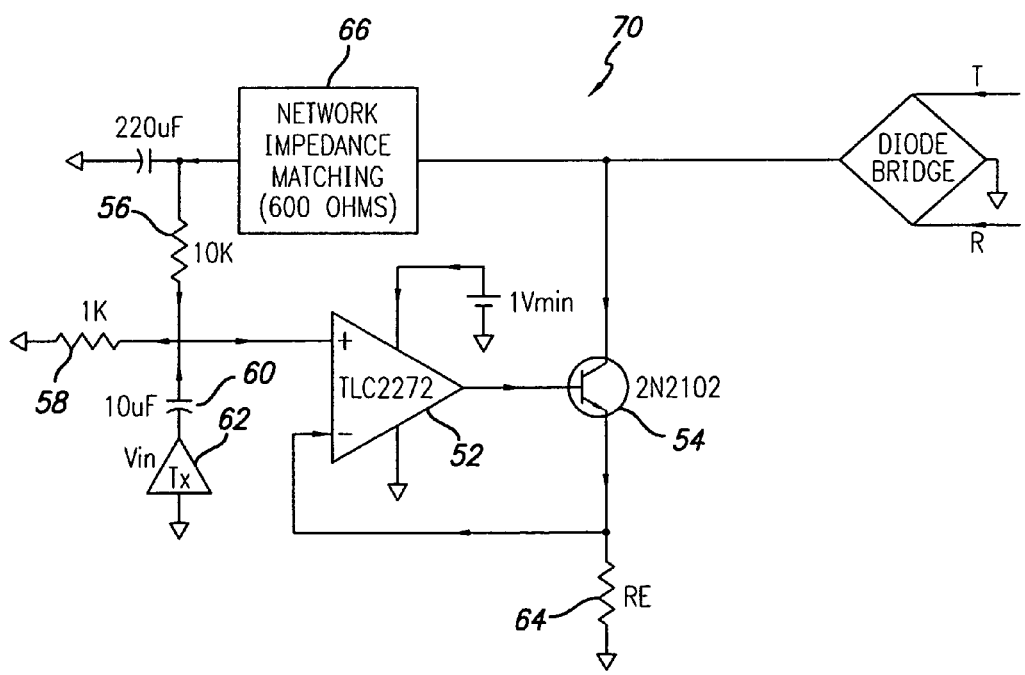
FIG. 4 is a schematic diagram of a second embodiment of the present invention.

A second embodiment 70 of the present invention is illustrated in FIG. 4. This embodiment is similar to the circuit shown in FIG. 3, except that the second transistor 68 is not used because the network impedance matching block 66 is configured as "virtual impedance." The circuit, however, still provides high performance with lower cost.

Figure 5:
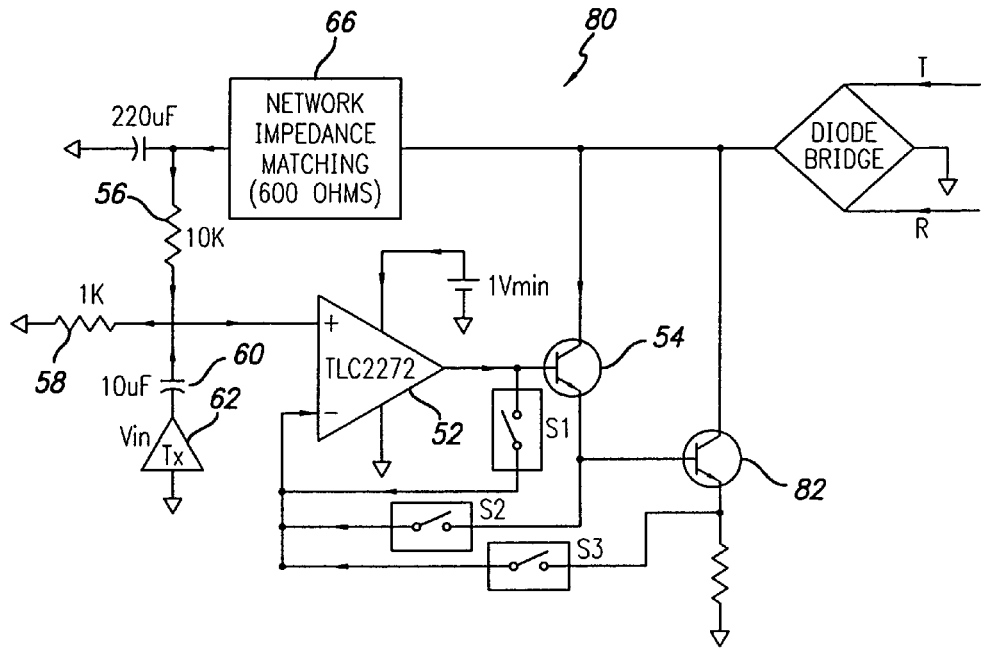
FIG. 5 is a schematic diagram of a third embodiment of the present invention.

A third embodiment of the present invention is shown in FIG. 5. A Darlington configuration 54, 82 is used for the electronic inductor transistor, which provides for multiple feedback points, as selected by closing one of the switches $S_1$, $S_2$, or $S_3$. This configuration provides a convenient platform for intelligent line voltage control, as different feedback points may be selected by external control logic (not shown) in order to properly set the desired DC voltage and current on the line.

Figure 6:
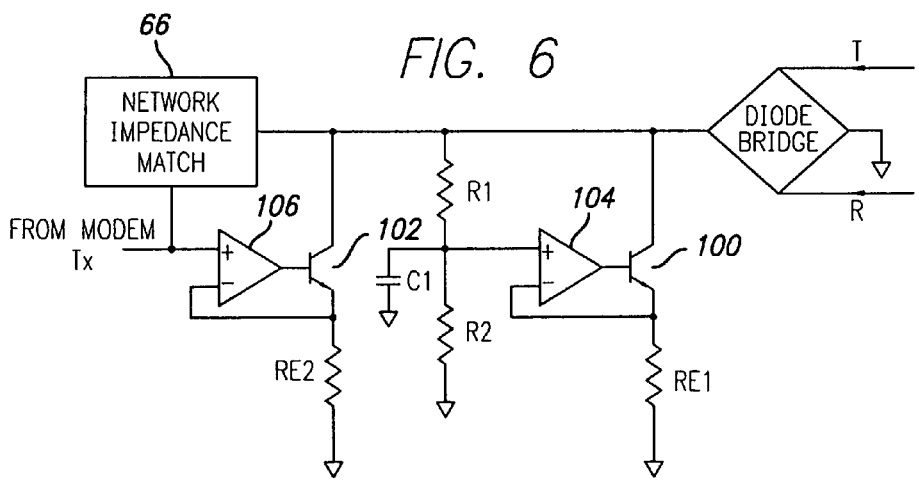
FIG. 6 is a schematic diagram of a fourth embodiment of the present invention.

A fourth embodiment of the present invention is shown in FIG. 6. As previously described herein, the same op-amp/transistor combination may be used to both drive the AC signal and to set the DC loop current. However, a separate op-amp/transistor combination could be used for the AC signal, and one for the DC current, in order to independently control their respective gains and to improve distortion. The first transistor 100 is used as described above to control the DC line current, determined by the resistors R1 and R2. The second transistor 102 controls the AC line current, which includes the virtual impedance feedback and the transmit signal of the modem. The effects of transistors 100, 102 and Q2 are independently summed to the line through currents ITR and Itr, respectively.

In this configuration, the DC transistor 100 can be biased in a non-linear region at any current without introducing distortion on the AC signal. Conversely, the AC transistor 102 can be biased with a sufficiently low current to operate in a linear region and provide excellent linearity in the AC signal transmitted to the line. Furthermore, this configuration allows the emitter resistors RE1 and RE2, of transistors 100 and 102, to set the gains independently for AC and DC, respectively.

The use of an operational amplifier driver for the electronic inductor transistor, whether the negative input of the op-amp is connected to the emitter of the transistor 100 or simply to the output of the op-amp itself (unity gain buffer), adds a very important benefit. A "hookswitch" is not required in the modem interface circuit to the telephone line.

A hookswitch is generally defined as a switch that physically disconnects the modem circuit components from the telephone line interface, when the modem goes on-hook. Due to the high impedance of the op-amp positive input, resistors R1 and R2 in FIG. 6 can be sufficiently large to provide only a negligible loading effect on the telephone line, when the modem is on-hook. Typically, the on-hook resistance requirement can be met worldwide when the sum of R1 and R2 is greater than 5 Mohms, which is a realistic resistor value. As a result, the electronic inductor in this configuration can be left permanently connected to the telephone line even when on-hook, provided that the base of the transistor is shorted to ground through a switch to prevent current flow through the transistor.

The present circuit configuration has excellent linear characteristics, requires a relatively small output voltage swing in the operational amplifier and in the transmit signal source, and can drive signals on the line as large as 5 volts peak-to-peak with power supplies as low as 1 volt. Because the input impedance of the operational amplifier is large, the transmit signal source does not have to be low-impedance and can be smaller in size and less expensive. Furthermore, this circuit is suitable for line-powered operation as the power supply required to obtain adequate voltage swing on the line can be relatively low.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An interface circuit capable of connecting a modem to a telephone line, said interface circuit comprising:
   a voltage-controlled current source, said voltage controlled current source including an operational amplifier having a positive input capable of being connected to a transmit signal driver of said modem, said operational amplifier having an output configured to drive a base of an electronic inductor transistor, said electronic inductor transistor capable of being connected across a rectified tip and ring voltage of said telephone line, wherein said interface circuit is configured to linearly vary a line current of said telephone line;
   a second transistor, said second transistor having a base connected to a collector of said electronic inductor transistor;
   an impedance matching circuit connected between said positive input of said operational amplifier and a collector of said second transistor;
   wherein said second transistor provides increased isolation for said modem when said modem is on-hook, and wherein a negative input of said operational amplifier is connected to an emitter of said electronic inductor transistor.

2. The interface circuit of claim 1 further comprising a voltage divider connected to said positive input of said operational amplifier.

3. The interface circuit of claim 1 further comprising a resistor connected to said emitter of said electronic inductor transistor.

4. The interface circuit of claim 1 further comprising a capacitor connected between said transmit signal driver and said positive input of said operational amplifier.

5. An interface circuit capable of connecting a modem to a telephone line, said interface circuit comprising:
   an electronic inductor transistor capable of being connected across a rectified tip and ring voltage of said telephone line;
   an operational amplifier having an output configured to drive a base of said electronic inductor transistor, wherein a hookswitch is not connected between said rectified tip and ring voltage and said modem, wherein said interface circuit is configured to linearly vary a line current of said telephone line;
   a second transistor, said second transistor having a base connected to a collector of said electronic inductor transistor;
   an impedance matching circuit connected between a positive input of said operational amplifier and a collector of said second transistor;
   wherein said second transistor provides increased isolation for said modem when said modem is on-hook, and wherein a negative input of said operational amplifier is connected to an emitter of said electronic inductor transistor.

6. The interface circuit of claim 5 further comprising a voltage divider connected to a positive input of said operational amplifier.

7. The interface circuit of claim 5 further comprising a resistor connected to said emitter of said electronic inductor transistor.

8. The interface circuit of claim 5 further comprising a capacitor connected between said transmit signal driver and said positive input of said operational amplifier.

9. A modem interface circuit capable of being coupled to a telephone line, said modem interface circuit comprising:
   a DC loop current circuit having a first operational amplifier, said first operational amplifier having a first output configured to drive a first base of a first electronic inductor transistor, said first electronic inductor transistor capable of being connected across a rectified tip and ring voltage of said telephone line;
   an AC current circuit having a second operation amplifier, said second operation amplifier having a second output configured to drive a second base of a second electronic inductor transistor, said second electronic inductor transistor capable of being connected across said rectified tip and ring voltage of said telephone line, wherein said interface circuit is configured to linearly vary a line current of said telephone line;
   wherein an emitter of said second electronic inductor transistor is coupled to ground, and wherein a first collector of said first electronic inductor transistor is connected to a second collector of said second electronic inductor transistor.

10. The modem interface circuit of claim 9 further comprising a voltage divider connected to a positive input of said first operational amplifier.

11. The modem interface circuit of claim 9 further comprising a resistor connected to an emitter of said first electronic inductor transistor.

12. The modem interface circuit of claim 9 wherein said second operation amplifier has a positive input capable of being connected to a transmit signal driver of a modem.

13. The modem interface circuit of claim 9 further comprising an impedance matching circuit connected between a positive input of said second operational amplifier and a collector of said second electronic inductor transistor.

* * * * *